(12) United States Patent
Mouli

(10) Patent No.: US 7,750,392 B2
(45) Date of Patent: Jul. 6, 2010

(54) EMBEDDED CACHE MEMORY IN IMAGE SENSORS

(75) Inventor: Chandra Mouli, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 227 days.

(21) Appl. No.: 12/074,446

(22) Filed: Mar. 3, 2008

(65) Prior Publication Data

US 2009/0219426 A1 Sep. 3, 2009

(51) Int. Cl.
*H01L 29/76* (2006.01)
(52) U.S. Cl. .................. 257/314; 257/328; 257/296; 257/401; 257/133; 257/E29.125; 365/185.18; 365/180; 438/211
(58) Field of Classification Search .......... 257/314, 257/328, 296, 401, 133, E29.125; 438/211; 365/185.18, 180
See application file for complete search history.

(56) References Cited

U.S. PATENT DOCUMENTS 5,448,513 A 9/1995 Hu et al. ............... 365/150

6,037,202 A * 3/2000 Witek ...................... 438/212

OTHER PUBLICATIONS

Nemati, Farid et al., "A Novel Thyristor-based SRAM Cell (T-RAM) for High-Speed, Low-Voltage, Giga-scale Memories", Institute of Electrical Electronics Engineers: IEDM, 1999, pp. 283-286.
Wann, Hsing-jen et al., "A Capacitorless DRAM Cell on SOI Substrate", Institute of Electrical Electronics Engineers: IEDM, 1993, pp. 635-638.

* cited by examiner

*Primary Examiner*—Tu-Tu V Ho
(74) *Attorney, Agent, or Firm*—Kramer Levin Naftalis & Frankel LLP

(57) ABSTRACT

An embodiment of an embedded cache memory in an image sensor comprises a memory cell array wherein the memory cells are substantially isolated from laterally adjacent memory. The memory cell array includes a plurality of memory cells. Each of the memory cells is formed in a standard CMOS image sensor process without the need for SOI processes. Each cell includes first and second n-type and p-type regions arranged around a vertically integrated gate. Data is written to a cell by causing carriers to accumulate in the body of the device through carrier generation mechanisms that may include impact ionization, band-to-band tunneling and/or channel-initiated secondary hot electrons.

4 Claims, 6 Drawing Sheets

EMBEDDED CACHE MEMORY IN IMAGE SENSORS

TECHNICAL FIELD

Embodiments of this invention relate to embedded cache memory, and, more particularly, to embedded cache memory in image sensors.

BACKGROUND OF THE INVENTION

Modern CMOS active pixel sensor (APS) designs can benefit significantly from having embedded cache memory in close proximity to the sensor array and more preferably, on the same die. Use of such embedded cache memory is not, however, without tradeoffs. For example, the memory elements and related logic periphery circuits require the use of die area that might otherwise be used for the image sensor array. For arrays with an equivalent number of pixels, a reduction in the size of the sensor array results in a reduction of the photo-active area of each pixel which directly results in reduced photo conversion efficiency. Additionally, reduced pixel area may not be desirable for high-performance sensors that require large fill factors for low noise and low light performance. Typical static RAM (SRAM) implementations of embedded cache memory are area intensive thereby exacerbating these problems.

Because the area requirements of SRAM cache are so large, embedded cache memories in various devices typically have used dynamic RAM (DRAM) caches. Conventional DRAM memories are not well suited for embedded memory due to the requirement for a relatively large capacitor for each cell and the specialized process required for fabricating such capacitors. Embedding memory in a CMOS process has, therefore, turned to alternative methods of fabricating memory cells that do not require a capacitor. FIG. 1 depicts a prior art DRAM cell 100 fabricated on a silicon-on-insulator (SOI) CMOS process. The memory cell 100 is constructed by two MOS transistors in series and sharing the same gate. The first MOS transistor is an NMOS device formed by a write bit line 110, a buried word line 115, a floating body storage node 120 and a shared word line gate 105. This NMOS transistor is used to store a data value in the form of charge on the storage node 120. The second MOS transistor is a PMOS device formed with the buried word line 115, the storage node 120, the read bit line 135 and the shared word line gate 105. This PMOS transistor is used to read the logic value from the storage node 120. The use of such a memory cell 100 in image sensors is not, however, without problems. The memory cell 100 requires a SOI substrate, which is expensive and not ordinarily a feature of CMOS APS process technologies. Also, and as is described in U.S. Pat. No. 5,448,513 to Hu et al., the memory cell 100 requires a relatively complex control scheme that requires the cell to be purged before writing any data value irrespective of the logic level to be written. Lastly, single-gated floating body effect based devices face serious challenges for scaling below 50 nm feature sizes.

FIG. 2 illustrates a prior art DRAM cell 200 that also utilizes an SOI CMOS process. The DRAM cell 200 features a drain 215, a gate 210 and a source 205 along with a floating body storage node region 220. A memory value is stored on the floating body storage node region 220 when a high-energy carrier undergoes a collision (scattering event) with the lattice of the floating body region near the boundary with the drain 215. For example, a high energy electron in the conduction band undergoes a scattering event and liberates an electron from the valence band, which results in the initial electron lowering its energy (i.e. its energy is transferred to the valence band electron) and a new electron/hole pair is formed in the floating body region. The electrons are swept out of the floating body region leaving behind excess holes. These holes may recombine or diffuse but do so relatively slowly due to the presence of the buried oxide layer 225. As a result, when the transistor 200 is turned off, the excess holes are trapped in the floating body storage node region 220 and represent the stored logic level. Although, the prior art cell 200 is an improvement over the memory cell 1 of FIG. 1 in that it is comprised of only a single transistor and thus will generally require less area, the planar nature of the device nevertheless presents similar issues with regard to scaling below 50 nm. Also, the DRAM cell 200 relies exclusively on impact ionization for generation of storage node carriers. Using only impact ionization for generating these carriers consumes a lot of power because the required drain current may be orders of magnitude greater than the hole current it supports. Also, impact ionization is strongly temperature dependent and decreases at higher temperatures due to increased lattice scattering thus leading to lower overall efficiency. Device reliability may also be compromised by hot electron effect or electron migration due to the high carrier energy required for ionization.

There is therefore a need for an embedded DRAM cell capable of scaling below 50 nm without the need for SOI processes and without being wholly dependent on impact ionization.

DETAILED DESCRIPTION OF THE INVENTION

Embodiments of the invention comprise a DRAM cell that stores charge in the bulk of a transistor that is isolated from neighboring cells, but without requiring SOI substrates or processes and without relying exclusively on impact ionization phenomena for carrier generation. Instead of SOI, embodiments of the invention are created using partially-isolated devices through oxide and/or other isolation techniques such as shallow trench isolation (STI). In addition to impact ionization, embodiments of the invention may also use band-to-band tunneling and channel-initiated secondary electron injection (CHISEL) for generating carriers. Bandto-band tunneling may be accomplished through gated-diode effect (GIDL) for amplification of charges and to increase floating body effect (FBE). Such embodiments can enable a "single-transistor" DRAM cell—albeit, with much higher refresh requirement compared to conventional DRAM cells. Higher refresh rates are a compromise for high density DRAM in a much simpler process and may be acceptable in system-on-chip (SOC) image sensor designs.

Figure 1:
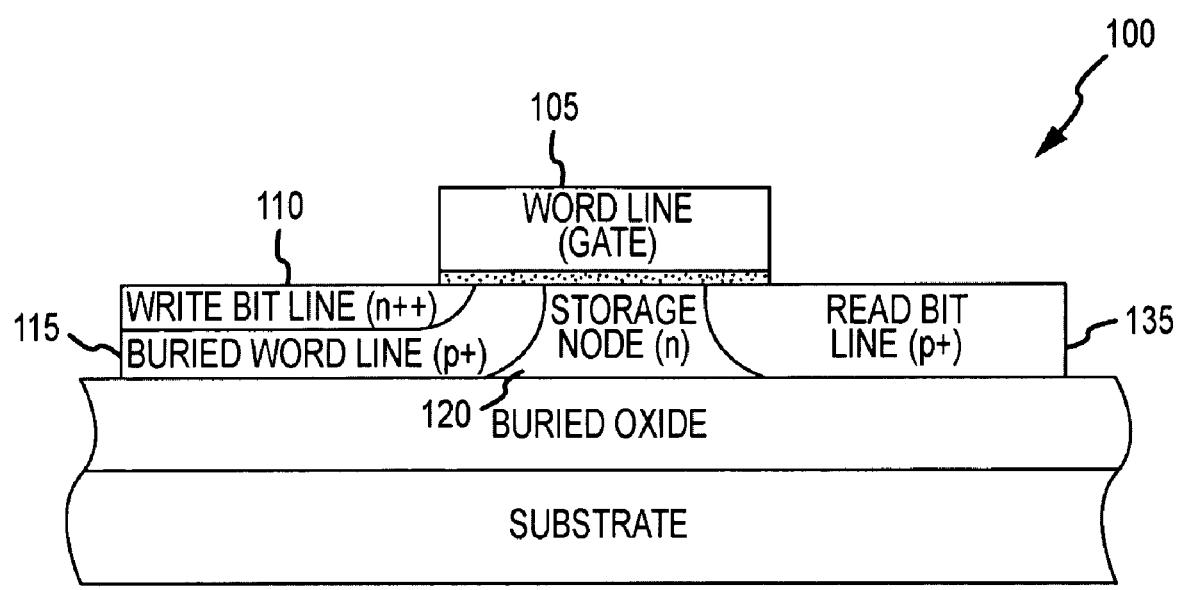
FIG. 1 is a cross-sectional view of an SOI DRAM cell according to the prior art.
Figure 2:
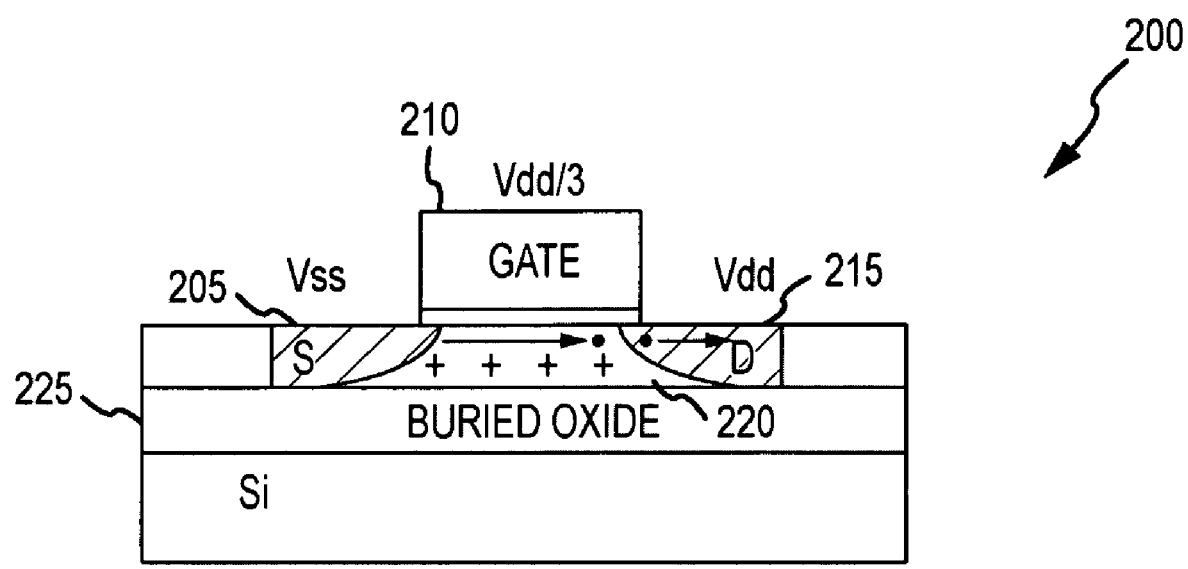
FIG. 2 is a cross-sectional view of another SOI DRAM cell according to the prior art.
Figure 3:
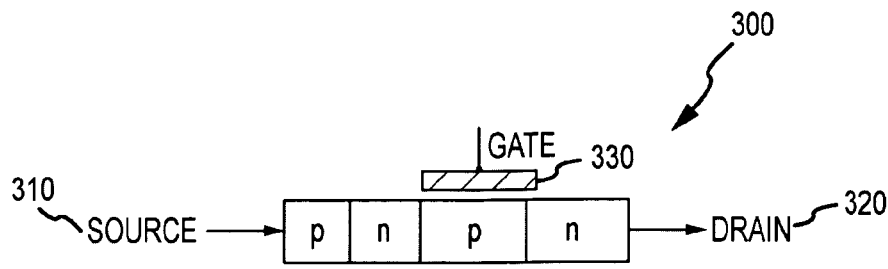
FIG. 3 is a schematic view of a thyristor according to embodiments of the invention.
Figure 4:
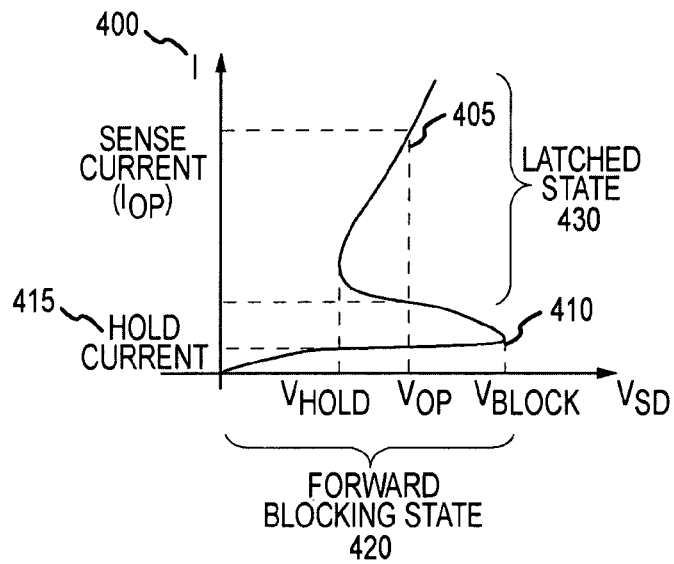
FIG. 4 illustrates a typical thyristor snapback curve.
Figure 5A:
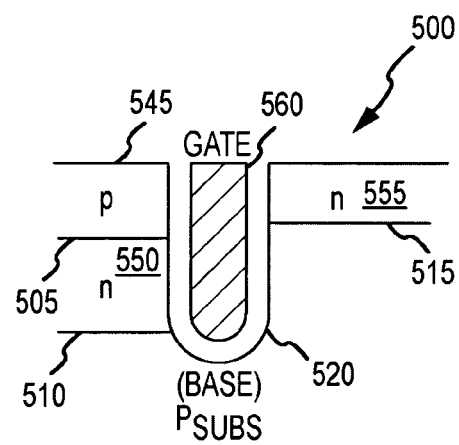
FIG. 5a illustrates a schematic cross sectional view of a vertically integrated recessed DRAM device according to embodiments of the invention.
Figure 5B:
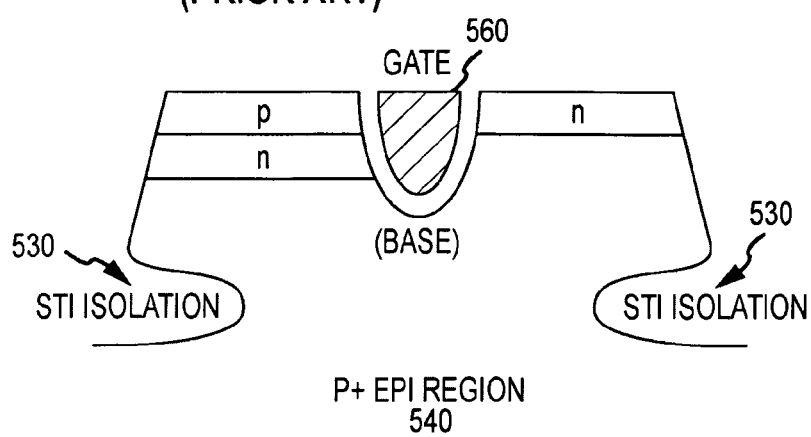
FIG. 5b illustrates an example embodiment of the device of FIG. 5a using isolation for enhanced floating body effect.

A DRAM cell in accordance with embodiments of the invention may be created by coupling an n/p/n/p thyristor structure 300, as shown in FIG. 3, to a capacitor—a simple MOS cap—using the gate of a short channel length & width transistor. The thyristor of FIG. 3 includes a source 310 and drain 320. Bi-stable characteristics of such thyristors are schematically shown in FIG. 4. FIG. 4 depicts the snap-back curve 400 of a typical thyristor. The curve 400 shows the current through the thyristor as a function of the source-drain voltage. As the voltage is increased from zero, the current through the device increases at a very low rate. Prior to reaching the voltage $V_{block}$ 410, the thyristor operates in the forward blocking state 420 as is known in the art. Once the voltage reaches $V_{block}$ 410, however, junction breakdown causes the device to snap-back to a low-impedance, high-current mode of operation corresponding to the latched state 430. The operating point 405 denoted by $V_{op}$ and $I_{op}$ as shown in FIG. 4 corresponds to the latched state 430. Once the device enters such a mode, current flow can be stopped only by decreasing the current below the hold current 415 as is well known in the art. One embodiment of the DRAM cell 500 structure and fabrication is shown in FIG. 5a. The DRAM cell 500 includes thyristor diodes 505, 510 and 515 that may be formed vertically on a recessed region 520 in the substrate by being aligned along each side of the vertically fabricated gate 560. The thyristor diode 505 is formed by the junction between a P region 545 and an N region 550. Likewise, the thyristor diode 510 is formed by the junction between the N region 550 and a P substrate region 540. The thyristor diode 515 is formed by the junction between the P substrate region 540 and an N region 555. These diodes form a thyristor as depicted in FIG. 3 with the P region 545 serving as the source, and the N region 555 serving as the drain. Likewise, the vertically fabricated gate 560 corresponds to the gate 330 of FIG. 3. The gate 560 forms a gate over the P substrate region 540 and between the N regions 550 and 555. Application of the appropriate voltage or pulse to the gate terminal permits an inversion in the P substrate region 540 in the area adjacent to the gate as with a convention NMOS transistor. Once the inverted channel has been created, current may flow from the P region 545 (source node) through the device and out through the N region 555 (drain node). During this time, additional carriers may be created in the substrate region 540 due to impact ionization, band-to-band tunneling and/or channel-initiated secondary electron injection (CHISEL). Such vertical formation of the gate 560 enables scaling down the area requirement of the device since the gate area is spread out vertically instead of horizontally as is schematically depicted in FIG. 3. Additionally, the diodes 505, 510 and 515 are not formed by multiple masking steps as in a planar diode configuration. Instead, a single mask level may be used to form complementary doped regions by varying the implant energy of the n- and p-type species. FIG. 5b illustrates a pseudo-SOI structure formed using STI isolation trenches 530. Such isolation decreases leakage currents thereby retaining the charge stored in the substrate 540 as long as possible and decreasing the required refresh rate. An embodiment of the invention would typically use a heavily doped p+epitaxial base region 540 to enhance the FBE and, therefore, charge storage of the base region. The embodiments of FIGS. 5a and 5b may be constructed in a conventional CMOS APS process without any major additions to process steps because such processes typically use p- on p+ epi substrates for improved cross talk and quantum efficiency. This makes it easy to integrate a FBE-based cell due to the larger FBE of the p+ epi region. Photodiodes are typically constructed using two or more mask levels dedicated for diode implant optimization. With suitable mask alignments, these mask levels can be used to create p/n/p/n structures. The same process can be used to create a recessed n/p/n/p structure for back-to-back diode.

Figure 6:
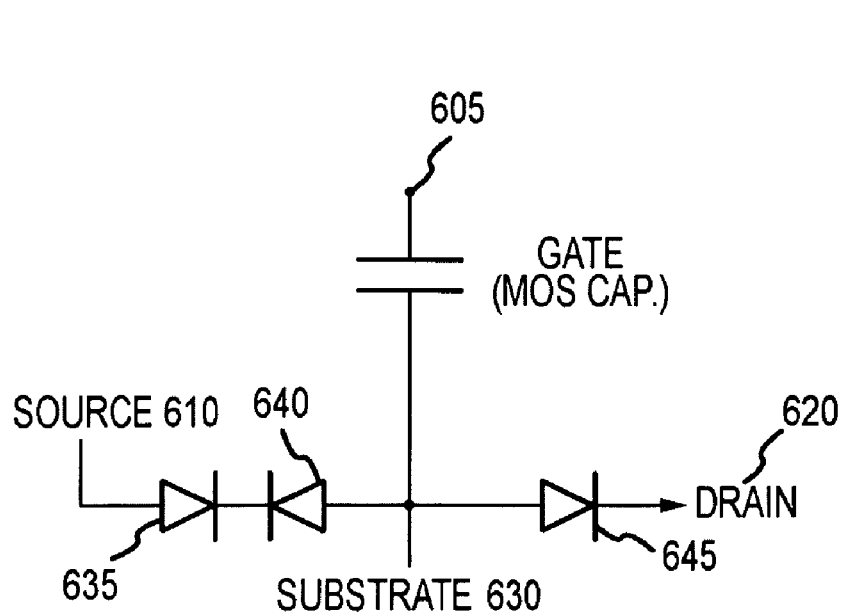
FIG. 6 is an equivalent circuit schematic of the DRAM cell of FIG. 5.

FIG. 6 illustrates an equivalent circuit schematic 600 of the DRAM cell 500 of FIG. 5. The circuit contains a source 610, a drain 620, a substrate node 630 and a gate capacitor 605. The equivalent circuit also has diodes 635, 640 and 645. These diodes correspond to the thyristor diodes 505, 510 and 515 respectively.

In operation, when both the drain 620 and the source 610 are at a high voltage (Vdd), the thyristor diodes 640 and 645 are back-biased to isolate the substrate node 630 so that charge does not leak from the node 630. As a result, the charge state of the substrate node 630 (p-type region) maintains the data stored. To write a '1' into the cell, a voltage or pulse is applied to the gate 605 while the drain 620 terminal is held at low bias, typically ground. This takes the thyristor cell out of the forward blocking state and into the low resistance latched state as discussed above in reference to FIG. 4. While current flows through the cell, carriers are generated and accumulate on the substrate node 630. Once the drain terminal is returned to a high bias state, current flow through the thyristor stops and the carriers generated in the substrate are trapped. Over time, these carriers will recombine and leak causing the stored '1' to decay in manner similar to conventional DRAM. Period refresh of the cell is, therefore, required to maintain the stored logic level. To write a '0' into the cell, the source 610 terminal is held at low bias while pulsing the gate 605. This completely drains all carriers from the substrate node 630 and puts the thyristor in its forward blocking state. To read, the drain 620 is taken low. In the case of a logic '1', the charged trapped on the substrate node 630 is coupled to the drain 620 and the change in current or voltage of the drain 620 (digit line) may be sensed by a sense amplifier (not shown). In the case of a logic '0', no charge is coupled to the drain 620 and its voltage remains unchanged. If the stored charge in the substrate node 630 p-type region is retained long enough—due to low recombination in the base—no refresh operation is necessary. In practice, however, the junctions will typically leak requiring refresh of the cell. For applications that do not demand tight requirements on refresh, such as embedded memory cells, this cell structure offers significant benefits such as high bit density and ease of integration.

Figure 7:
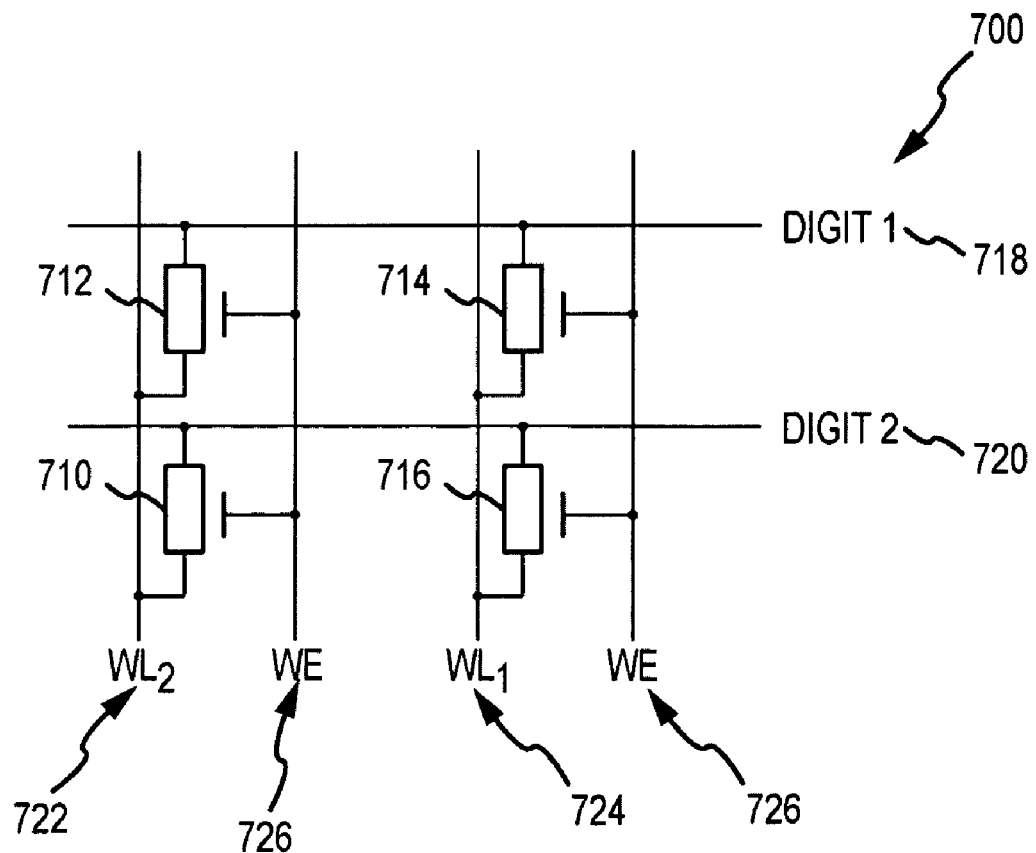
FIG. 7 is a circuit schematic of a portion of a memory array utilizing DRAM cells according to embodiments of the invention.

Signals are coupled to and from the cell 500 through control lines—word line, digit line and a write-enable line, as illustrated in FIG. 7. A memory cell array 700 includes cells 710-716 that may be instances of the equivalent circuit schematic as shown in FIG. 6. Cells 712 and 714 are connected by their drains to a common digit line 718 while cells 710 and 716 likewise are connected to a common digit line 720. The cells 714 and 716 may have their source nodes connected to a common word line 724 whereas cells 710 and 712 share the word line 722. The cells may also have their gate nodes coupled to one or more write enable lines 726. As described above, the memory cell 716, for example, may be written with a logic '1' by holding the digit line 720 low while pulsing the gate of the cell via the write enable line 726. Likewise, writing a logic '0' to the memory cell 716 may be accomplished by holding the word line 724 low while pulsing the write enable line 726. Reading is accomplished by drawing the digit line 720 low. As was discussed above, in the case where a logic '1' is stored in the memory cell 716, charge will be coupled to the digit line resulting in a change in voltage and/or current on the digit line that may be sensed with an appropriate amplifier (not shown). Where no charge is stored, such an amplifier would detect a logic '0' on the digit line 720.

Figure 8:
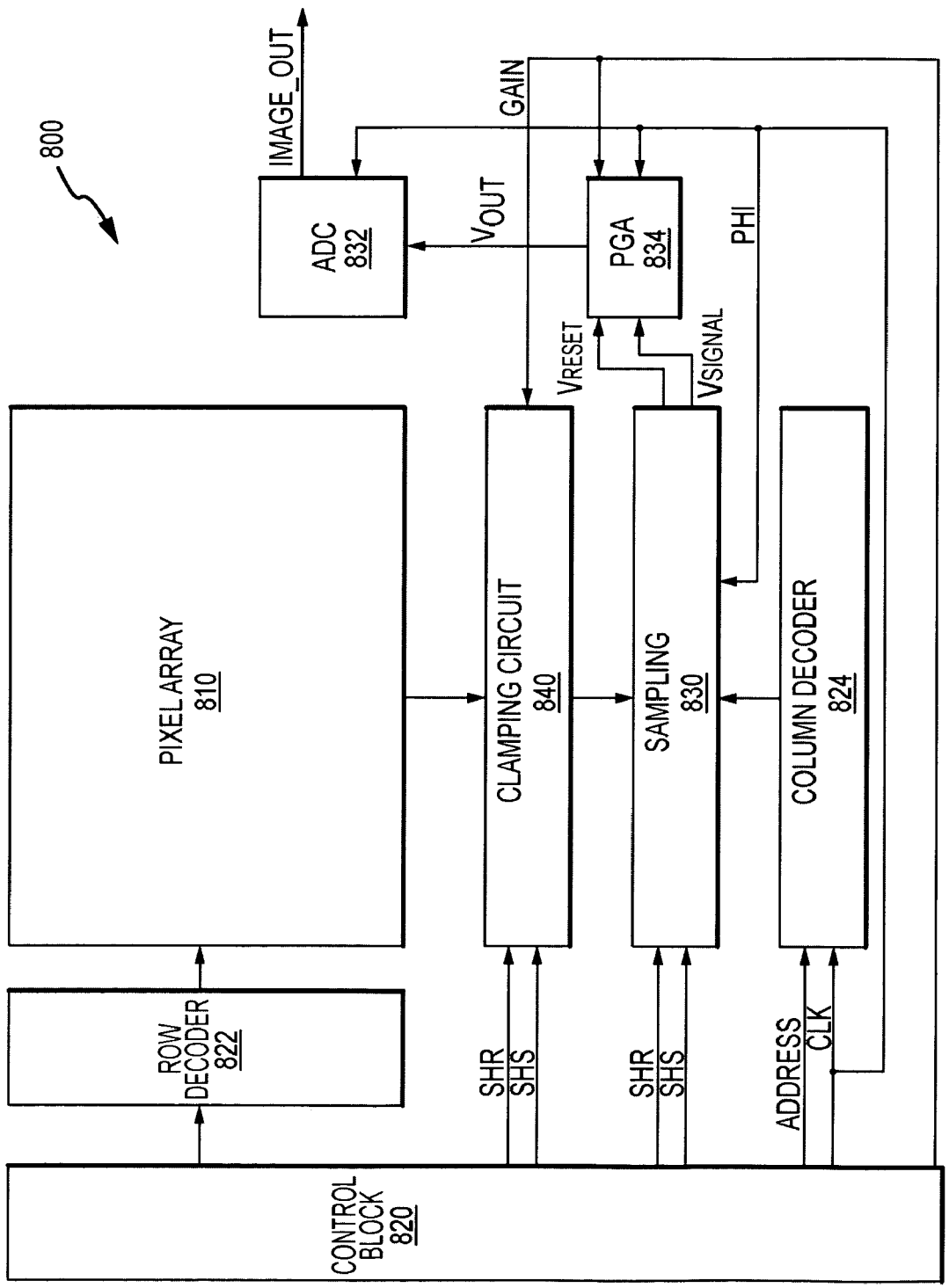
FIG. 8 is a block diagram of a CMOS imager device according to an embodiment of the invention.

FIG. 8 illustrates a CMOS imager device 800 according to an embodiment of the invention. A plurality of pixel cells arranged in rows and columns are respectively connected to a plurality of row and column lines that are provided for the entire array 810. The pixels of each row in the array 810 are accessed at the same time by a row select line coupled to respective drivers (not shown) in response to a row address received by a row decoder 822. Similarly, the pixels of each column in the array 810 are selectively outputted by respective column select lines coupled to drivers (also not shown) in response to a column address being decoded by a column decoder 824. Therefore, each pixel has a row address and a column address.

A control block 820 controls the operation of the CMOS imager device 800, which includes controlling the address decoders 822, 824 for selecting the appropriate row and column lines for pixel readout. As known in the art, the pixel output signals typically include a pixel reset signal Vreset that is read out of the sensing region or the diffusion node after the pixel cell is reset and a pixel image signal Vsignal, which is read out of the diffusion region after photo-generated charges are transferred to the region due to the impinging light on the photosensor. A sampling circuit 830 samples the Vreset and the Vsignal signals and provides the signals to an amplifier, such as a programmable gain amplifier (PGA) 834. The signals are typically subtracted by the amplifier 834 to generate an output signal Vout. The control block 820 may additionally provide a gain control signal GAIN to the amplifier 834 to amplify the received Vout signal as needed. Taking the difference between the two signals, Vreset-Vsignal, which is also known as correlated double sampling (CDS) in the art, represents the amount of light impinging on the pixel. The Vout signal is then converted to a digital signal by an analog-to-digital converter (ADC) 832 to produce a digital image signal IMAGE_OUT that may be electronically stored or further processed to form a digital image. Many of the sub-components of the CMOS imager 800 may require DRAM cache according to embodiments of the invention. For example, the control block 820 may require storage of generated row and column addresses or the ADC 832 may use DRAM for temporary storage of image information prior to readout or latching of the data. The pixel array 810 may also incorporate DRAM memory for temporary storage of the row address provided by the row decoder 822.

Figure 9:
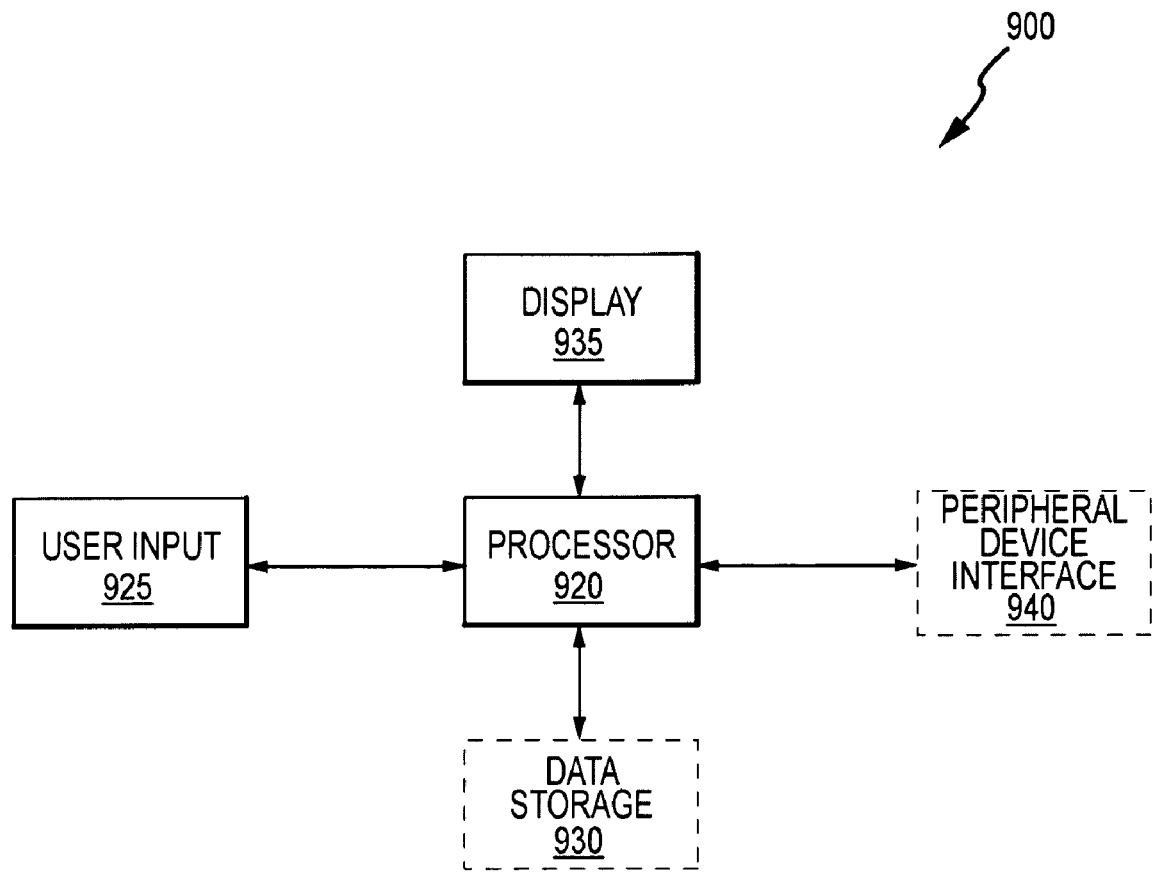
FIG. 9 is a simplified block diagram of a processor-based system that includes the CMOS imager device of FIG. 6 according to another embodiment of the invention.

FIG. 9 is a block diagram of a consumer device 900 having a processor 920 and a user input 925 that may include the CMOS imager device 800 of FIG. 8 according to embodiments of the invention. The consumer device 900 may be a digital camera, a vehicle navigation system, videophone, cell phone, audio player with imaging capabilities, or other small devices and portable devices that utilize CMOS imaging technology. The processor 920 may be a microprocessor, digital signal processor, or part of a central processing unit that communicates with the user input 925 over a bus. The processor 920 may additionally have a random access memory (RAM) or, alternatively, the user input 925 may include the RAM to which the processor communicates over the bus. The CMOS imager device 800 may be combined with the processor 920 with or without memory storage on a single integrated circuit or on a different chip than the processor 920. The consumer device 900 includes a display 935, such as a cathode ray tube (CRT) or liquid crystal display (LCD), for displaying information captured by the imager device 800. The consumer device 900 may also include a storage device 930, such as removable Flash memory, capable of storing data processed by processor 920, including, for example, digital image data. The consumer device 900 may optionally have a peripheral device interface 940 so that the processor 920 may communicate with a peripheral device (not shown). A number of peripheral devices may be connected to the consumer device 900, such as a camera lens, an audio recorder or a microphone, or a battery pack.

From the foregoing it will be appreciated that, although specific embodiments of the invention have been described herein for purposes of illustration, it will be understood by one skilled in the art that various modifications may be made without deviating from the invention. Accordingly, the invention is not limited except as by the appended claims.

What is claimed is:

1. A memory cell comprising:
   a first semiconductor region of a first doping type;
   a second semiconductor region of a second doping type, the second doping type being different from the first doping type, the second semiconductor region being adjacent to the first semiconductor region;
   a third semiconductor region of the first doping type adjacent to the second semiconductor region;
   a fourth semiconductor region of the second doping type adjacent to the third semiconductor region; and
   a gate extending into the third semiconductor region and having the first and second semiconductor regions on a first side of the gate, having the fourth semiconductor region on a second side of the gate, and having the third semiconductor region on the remaining portions of the gate, each of the semiconductor regions being capacitively coupled to the gate.

2. The memory cell of claim 1 wherein the memory cell is substantially isolated by shallow trench isolation.

3. The memory cell of claim 2 wherein the first and third semiconductor regions are P-type semiconductor and the second and fourth semiconductor regions are N-type semiconductors.

4. The memory cell of claim 1 wherein the first semiconductor region is doped more heavily than the third semiconductor region.

* * * * *